US011025228B1

(12) United States Patent
Ascarrunz et al.

(10) Patent No.: US 11,025,228 B1
(45) Date of Patent: Jun. 1, 2021

(54) DYNAMIC NOISE SHAPING FILTERS AND CORRESPONDING METHODS

(71) Applicant: Honeywell International Inc., Morris Plains, NJ (US)

(72) Inventors: Leonardo Ascarrunz, Lafayette, CO (US); Corey Barnes, Lafayette, CO (US); Ryan Jacobs, Lakewood, CO (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/872,783

(22) Filed: May 12, 2020

(51) Int. Cl.
*H03K 5/00* (2006.01)
*G06N 10/00* (2019.01)
*H03H 11/04* (2006.01)

(52) U.S. Cl.
CPC ............. *H03H 11/04* (2013.01); *G06N 10/00* (2019.01)

(58) Field of Classification Search
CPC .............................. H03H 11/04; G06N 10/00
See application file for complete search history.

(56) References Cited

U.S. PATENT DOCUMENTS

| 5,450,350 | A | * | 9/1995 | Sakata | H03H 17/0294 708/322 |
| 5,827,987 | A | * | 10/1998 | Kosugi | G10H 1/125 84/604 |
| 7,411,187 | B2 | * | 8/2008 | Monroe | H01J 49/0018 250/290 |
| 7,492,216 | B2 | * | 2/2009 | Kurimoto | H03H 11/1291 327/552 |
| 8,836,416 | B2 | * | 9/2014 | Fan | H03K 5/2481 327/554 |
| 2009/0315619 | A1 | * | 12/2009 | Ikeda | H03H 11/1291 327/553 |

* cited by examiner

*Primary Examiner* — Dinh T Le
(74) *Attorney, Agent, or Firm* — Alston & Bird LLP

(57) ABSTRACT

Various embodiments provide methods, apparatuses, systems, or computer program products for providing a signal with dynamically shaped noise. In an example embodiment, the system comprises a dynamic filter, wherein a dynamic filter is a filter that is capable of switching between at least two responses; a signal generator configured to generate a signal; and a controller configured to control operation of the signal generator and selection of an operating response from the at least two responses of the dynamic filter. The controller causes the signal generator to generate a signal, the signal is provided to the dynamic filter, and the controller causes the dynamic filter to filter the signal in accordance with the operating response. The filtered signal is then provided to an electrical component of the system to cause at least a portion of the system to perform a function.

20 Claims, 8 Drawing Sheets

DYNAMIC NOISE SHAPING FILTERS AND CORRESPONDING METHODS

TECHNICAL FIELD

Various embodiments relate to apparatuses, systems, and methods for dynamically shaping signal noise. For example, some example embodiments relate to the dynamic shaping of noise of a signal applied to an electrode of an ion trap.

BACKGROUND

In various scenarios, a system having electrical components may be configured to perform multiple functions and different functions may have different tolerances for the noise present in the signals applied to various electrical components. For example, an ion trap can use a combination of electrical and magnetic fields to capture a plurality of ions in a potential well. Various functions may be performed to cause the ions to move in particular ways through portions of the ion trap and/or be contained in a particular portion of the ion trap. These various functions may have differing noise tolerances in the signals used to generate the combination of electrical and magnetic fields. Through applied effort, ingenuity, and innovation, many deficiencies of such prior ion traps have been solved by developing solutions that are structured in accordance with the embodiments of the present invention, many examples of which are described in detail herein.

BRIEF SUMMARY OF EXAMPLE EMBODIMENTS

Example embodiments provide methods, systems, apparatuses, computer program products and/or the like for dynamically shaping the noise in a signal applied to an electrical component of a system. For example, various embodiments provide a dynamic filter, which is a filter with a response that may be dynamically adjusted. In an example embodiment, the response of the dynamic filter may be adjusted or switched between two or more responses. For example, an example embodiment comprises an ion trap comprising a plurality of electrodes wherein a signal applied to at least one electrode experiences dynamic shaping of the signal noise based on a function being performed within the ion trap.

According to a first aspect, a system for providing a signal with dynamically shaped noise is provided. In an example embodiment, the system comprises a dynamic filter, wherein a dynamic filter is a filter that is capable of switching between at least two responses; a signal generator configured to generate a signal; and a controller configured to control operation of the signal generator and selection of an operating response from the at least two responses of the dynamic filter. The controller causes the signal generator to generate a signal, the signal is provided to the dynamic filter, and the controller causes the dynamic filter to filter the signal in accordance with the operating response. The filtered signal is then provided to an electrical component of the system to cause at least a portion of the system to perform a function.

In an example embodiment, the system further comprises a filter driver, wherein the filter driver is controlled by the controller to activate one or more switches or attenuators of the dynamic filter to select the operating response from the at least two responses of the dynamic filter. In an example embodiment, the at least two responses comprise a first response and a second response, the first response being a combined first and second low pass filter response and the second response being a second low pass filter response, the second low pass filter response having a higher cut-off frequency than the first low pass filter response. In an example embodiment, the at least two responses comprise a first response and a second response, the first response being a recombined high pass filter response and a first low pass filter response, the high pass filter response and the first low pass filter response having a same cut-off frequency, combined with a second low pass filter response and the second response being a combined first and second low pass filter response, the second low pass filter response having a higher cut-off frequency than the first low pass filter response. In an example embodiment, the controller is further configured to determine a function to be performed via application of the filtered signal to the electrical component of the system; and select the operating response from the at least two responses based on the determined function. In an example embodiment, the controller is further configured to determine a second function to be performed; select a second operating response from the at least two responses based on the determined second function; and cause dynamic filter to filter a second part of the signal to be filtered based on the second operating response, wherein application of the second part of the signal to the electrical component of the system causes the system to perform the second function. In an example embodiment, the system is a quantum computer and/or a portion of a quantum computer. In an example embodiment, the electrical component is an electrode of an ion trap having a plurality of ions trapped therein, at least some of the plurality of ions being used as qubits of the quantum computer.

According to another aspect, a method for providing a signal with dynamically shaped noise to an electrical component of a system. In an example embodiment, the method comprises causing, by a controller of the system, a signal generator to generate a signal; and causing, by the controller, a dynamic filter to operate with an operating response, wherein the dynamic filter is a filter that is capable of switching between at least two responses. The signal generated by the signal generator is provided to the dynamic filter, the dynamic filter filters the signal in accordance with the operating response, and the filtered signal is provided to the electrical component of the system to cause at least a portion of the system to perform a function.

In an example embodiment, the controller causes the dynamic filter to operate with the operating response by controlling a filter driver, wherein the filter driver is controlled by the controller to activate one or more switches or attenuators of the dynamic filter to select the operating response from the at least two responses of the dynamic filter. In an example embodiment, the at least two responses comprise a first response and a second response, the first response being a combined first and second low pass filter response and the second response being a second low pass filter response, the second low pass filter response having a higher cut-off frequency than the first low pass filter response. In an example embodiment, the at least two responses comprise a first response and a second response, the first response being a recombined high pass filter response and a first low pass filter response, the high pass filter response and the first low pass filter response having a same cut-off frequency, combined with a second low pass filter response and the second response being a combined first and second low pass filter response, the second low pass filter response having a higher cut-off frequency than the first low pass filter response. In an example embodiment, the method further comprises determining, by the controller, a function to be performed via application of the filtered signal to the electrical component of the system; and selecting, by the controller, the operating response from the at least two responses based on the determined function. In an example embodiment, the method further comprises determining, by the controller, a second function to be performed; selecting, by the controller, a second operating response from the at least two responses based on the determined second function; and causing, by the controller, the dynamic filter to filter a second part of the signal to be filtered based on the second operating response, wherein application of the second part of the signal to the electrical component of the system causes the system to perform the second function. In an example embodiment, the system is a quantum computer. In an example embodiment, the electrical component is an electrode of an ion trap having a plurality of ions trapped therein, at least some of the plurality of ions being used as qubits of the quantum computer.

According to yet another aspect, a computer program product is provided. In an example embodiment, the computer program product comprises a non-transitory, machine-readable storage medium storing executable instructions that, when executed with a processor of a controller, cause the controller to cause a signal generator to generate a signal; and cause a dynamic filter to operate with an operating response, wherein the dynamic filter is a filter that is capable of switching between at least two responses. The signal generated by the signal generator is provided to the dynamic filter, the dynamic filter filters the signal in accordance with the operating response, and the filtered signal is provided to an electrical component of a system to cause at least a portion of the system to perform a function.

In an example embodiment, the computer program product comprises a non-transitory, machine-readable storage medium storing executable instructions that, when executed with a processor of a controller, cause the controller to cause the dynamic filter to operate with the operating response by controlling a filter driver, wherein the filter driver is controlled by the controller to activate one or more switches or attenuators of the dynamic filter to select the operating response from the at least two responses of the dynamic filter. In an example embodiment, the at least two responses comprise a first response and a second response, the first response being a combined first and second low pass filter response and the second response being a second low pass filter response, the second low pass filter response having a higher cut-off frequency than the first low pass filter response. In an example embodiment, the at least two responses comprise a first response and a second response, the first response being a recombined high pass filter response and a first low pass filter response, the high pass filter response and the first low pass filter response having a same cut-off frequency, combined with a second low pass filter response and the second response if a combined first and second low pass filter response, the second low pass filter response having a higher cut-off frequency than the first low pass filter response. In an example embodiment, the computer program product comprises a non-transitory, machine-readable storage medium storing executable instructions that, when executed with a processor of a controller, cause the controller to determine a function to be performed via application of the filtered signal to the electrical component of the system; and select the operating response from the at least two responses based on the determined function. In an example embodiment, the computer program product comprises a non-transitory, machine-readable storage medium storing executable instructions that, when executed with a processor of a controller, cause the controller to determine a second function to be performed; select a second operating response from the at least two responses based on the determined second function; and cause the dynamic filter to filter a second part of the signal to be filtered based on the second operating response, wherein application of the second part of the signal to the electrical component of the system causes the system to perform the second function. In an example embodiment, the system is a quantum computer. In an example embodiment, the electrical component is an electrode of an ion trap having a plurality of ions trapped therein, at least some of the plurality of ions being used as qubits of the quantum computer.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 1 provides a top view of an example atomic object confinement apparatus that may be used in example embodiment.

FIG. 2 is a block diagram illustrating a system for dynamically shaping the signal noise of a signal to be applied to an electrode of an example atomic object confinement apparatus, in accordance with an example embodiment.

FIG. 3 is a flowchart of various processes, procedures, and/or operations that may be performed, for example, by a controller of the atomic object confinement apparatus, to dynamically shape the signal noise of a signal applied to an electrode of the atomic object confinement apparatus based on function to be performed by the atomic object confinement apparatus via application of the signal to the electrode, in accordance with an example embodiment.

Figure 7:
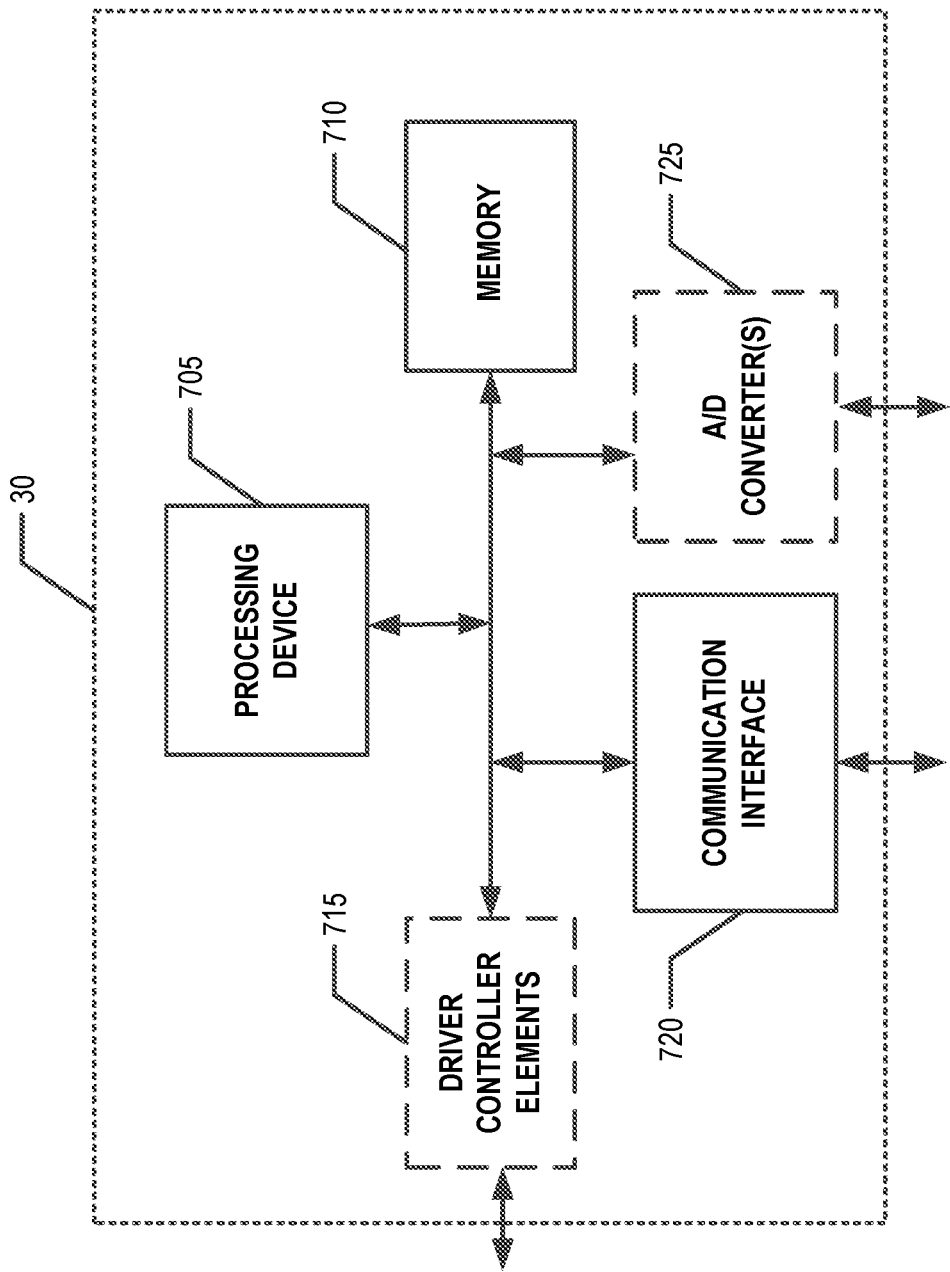

FIG. 7 provides a schematic diagram of an example controller of a quantum computer configured to perform dynamic signal noise shaping, according to various embodiments.

Figure 8:
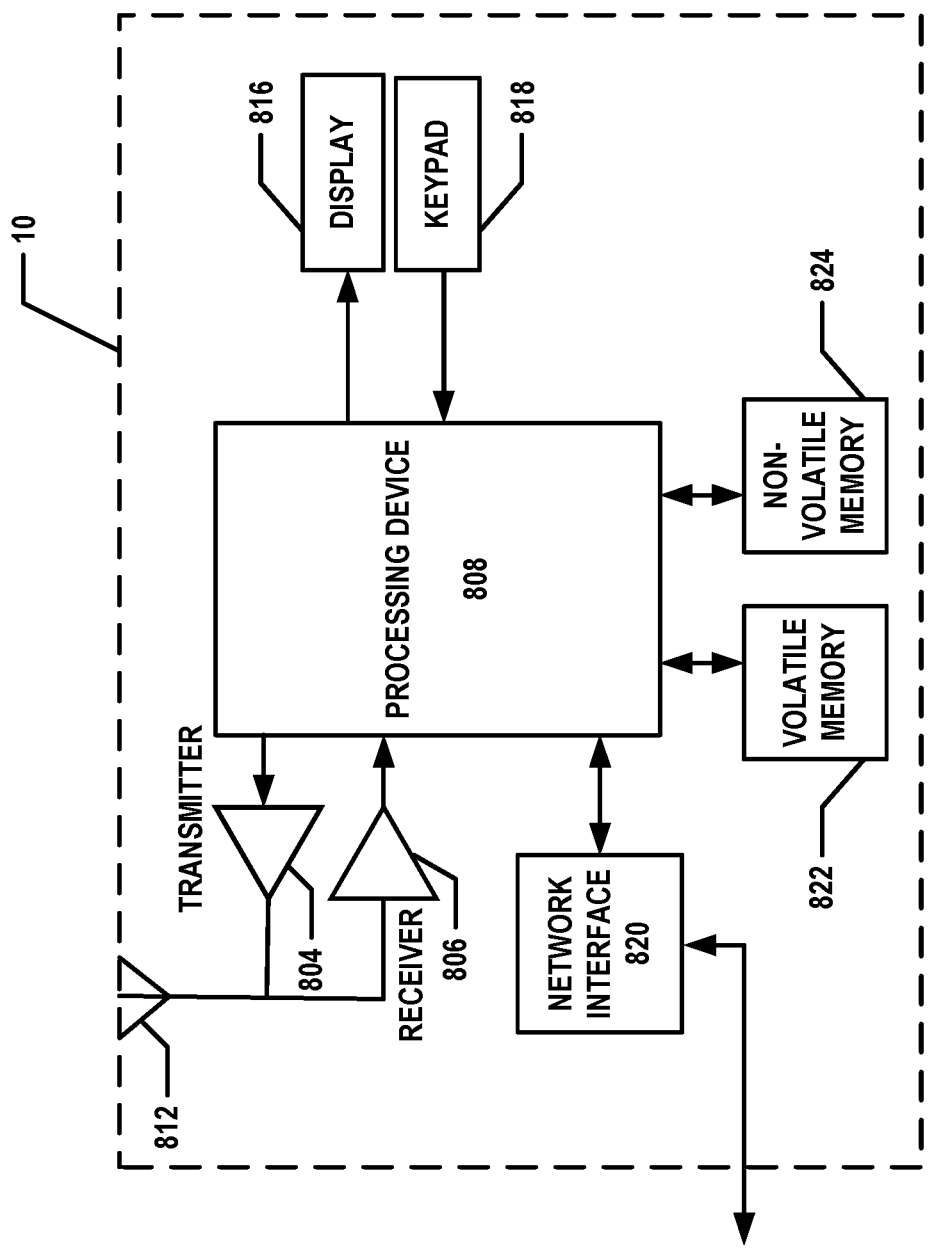

FIG. 8 provides a schematic diagram of an example computing entity of a quantum computer system that may be used in accordance with an example embodiment.

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally" and "approximately" refer to within engineering and/or manufacturing limits and/or within user measurement capabilities, unless otherwise indicated. Like numbers refer to like elements throughout.

In various embodiments, methods, apparatuses, systems, computer program products, and/or the like for generating and providing signals having dynamically shaped noise. For example, a signal may be generated (e.g., by a waveform generator) and applied to an electrical component (e.g., electrode) of a system. Application of the signal to the electrical component may cause the system to perform a function. In various embodiments, depending on the signal applied to the electrical component, the system may be configured to perform a variety of functions. In an example embodiment, different functions of the variety of functions may have different requirements regarding the amount of noise and/or the frequency of noise in the applied signal that can be tolerated. In various embodiments, a dynamic filter is used to filter the signal (e.g., generated by the wave generator) prior to the signal being applied to the electrical component (e.g., electrode) of the system. A dynamic filter is a filter with a response that may be dynamically adjusted. In particular, a dynamic filter is capable of filtering a signal with at least two responses. An operating response that is currently being used to filter the signal may be selected (e.g., via operation of one or more switches, attenuators, and/or the like) from the two or more responses. Additionally, the operating response may be changed dynamically (e.g., during operation of the system) as desired and/or required such that the system may perform various functions via a function-appropriate and/or function-specific shaping of the noise of the signal.

In an example embodiment, the system is a quantum computer. For example, the system may a trapped ion quantum computer comprising an ion trap comprising a plurality of electrodes. Application of voltage signals to the electrodes may cause the ion trap to perform various functions corresponding to moving or maintaining atomic objects (e.g., ions, atoms, and/or the like) trapped within the ion trap. For example, the various functions may include transporting atomic objects from one location within the ion trap to another location in the ion trap, maintaining an atomic object in a particular location within the ion trap so that quantum logic gate may be performed on the atomic object, causing two atomic objects to swap positions within the ion trap, cause two atomic objects to move close together, cause two atomic objects that are close together move apart from one another, and/or the like. Each of these functions may be associated with functions-specific noise tolerances. Based on the function-specific noise tolerances corresponding to a function, the function may be assigned a particular response of the two or more responses of the dynamic filter. Thus, when the wave generator is generates a signal that, when applied to an electrode of the system (e.g., ion trap), the system will perform a particular function, the dynamic filter is controlled to filter the signal using the response assigned to the function as the operating response. The signal with dynamically shaped noise may then be applied to the electrode so that the ion trap will perform the function and the noise tolerances of the function will be appropriately met.

Exemplary Atomic Object Confinement Apparatus

In an example embodiment, the system is or comprises an atomic object confinement apparatus (also referred to as a confinement apparatus herein). In an example embodiment, the confinement apparatus is an ion trap (e.g., a surface ion trap). For example, the ion trap may comprise a plurality of electrodes configured to receive electrical signals (e.g., voltages) so as to generate a potential field that controls the movement of one or more atomic objects (e.g., ions) within the ion trap.

Various functions performed to control the movement of the one or more atomic objects may have different noise requirements. For example, the noise requirements for performing a transport function, wherein an atomic object is moved from one location in the ion trap to another location in the ion trap, may be a first noise requirement and the noise requirements for maintaining an atomic object at a particular location within the ion trap (e.g., so that a gate operation of a quantum computer for which the atomic object is a qubit may be performed) may be a second noise requirement. In an example embodiment, the first noise requirement and the second noise requirement may be different. For example, when performing the transport function, performance of the function may be sensitive to noise at frequencies around 1 MHz. In another example, when performing the maintaining function (e.g., maintaining the atomic object at a particular location within the ion trap so that a quantum logic gate may be executed on the atomic object), performance of the function may be sensitive to noise at frequencies around 250 kHz. Thus, performing the transport function using the noise requirements configured to optimize performance of the maintaining function, leads to decreased performance of the transport function. For example, performing the transport function using the noise requirements configured to optimize performance of the maintaining function decreases the speed and/or bandwidth with which the transport function may be performed.

Figure 1:
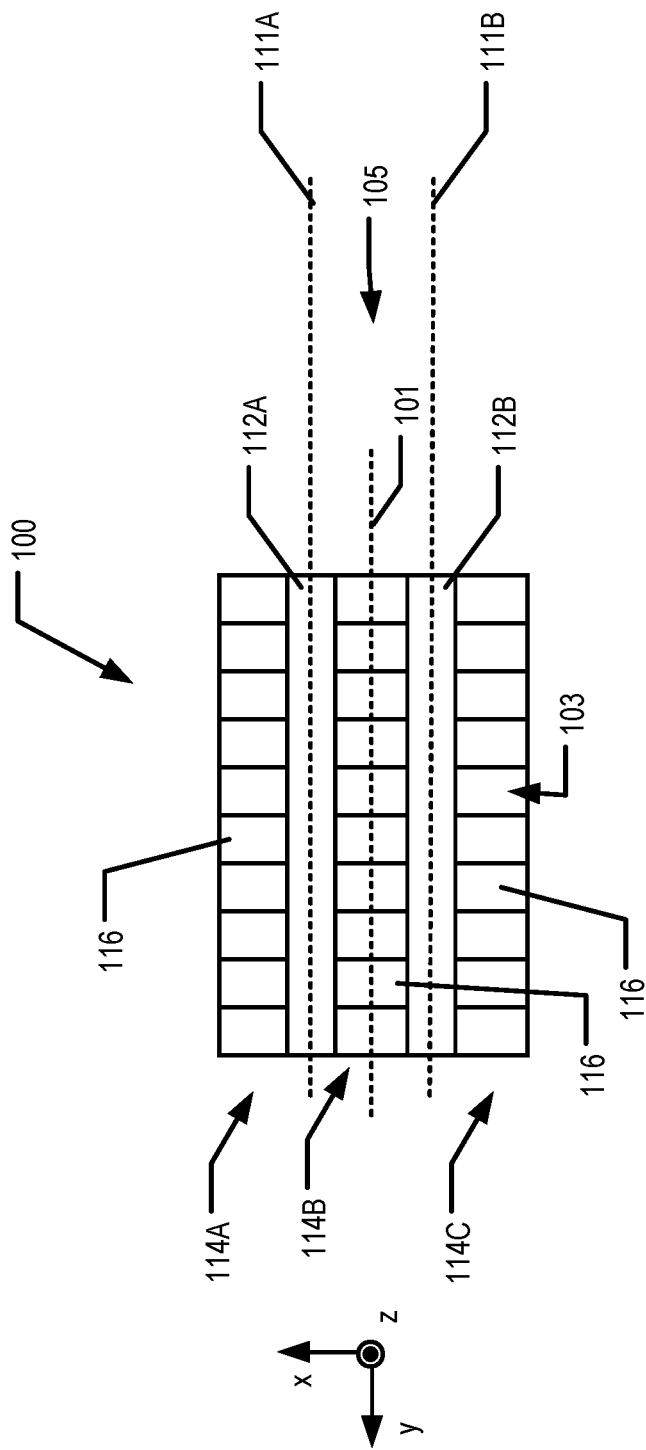

FIG. 1 provides a top schematic view of an example surface ion trap 100. In an example embodiment, the surface ion trap 100 is fabricated as part of an ion trap chip and/or part of an ion trap apparatus and/or package. In an example embodiment, the surface ion trap 100 is at least partially defined by a number of radio frequency (RF) rails 112 (e.g., 112A, 112B). In various embodiments, the ion trap 100 is at least partially defined by a number of sequences of trapping and/or transport (TT) electrodes 114 (e.g., 114A, 114B, 114C). In an example embodiment, the ion trap 100 is a surface Paul trap with symmetric RF rails. In various embodiments, the potential generating elements of the confinement apparatus comprise the TT electrodes 116 of the sequences of TT electrodes 114 and/or the RF rails 112. In various embodiments, the upper surface of the ion trap 100 has a planarized topology. For example, the upper surface of each RF rail 112 of the number of RF rails 112 and the upper surface of each TT electrode 116 of the number of sequences of TT electrodes 114 may be substantially coplanar.

In various embodiments, the ion trap 100 comprises and/or is at least partially defined by a number of RF rails 112. The RF rails 112 are formed with substantially parallel longitudinal axes 111 (e.g., 111A, 111B) and with substantially coplanar upper surfaces. For example, the RF rails 112 are substantially parallel such that a distance between the RF rails 112 is approximately constant along the length of the RF rails 112 (e.g., the length of an RF rail being along the longitudinal axes 111 of RF rail 112). For example, the upper surfaces of the RF rails 112 may be substantially flush with the upper surface of the ion trap 100. In an example embodiment, the number of RF rails 112 comprises two RF rails 112 (e.g., 112A, 112B). In various embodiments, the ion trap 100 may comprise a plurality of number of RF rails 112. For example, the ion trap 100 may be a two-dimensional ion trap that comprises multiple numbers (e.g., pairs and/or sets) of RF rails 112 with each number (e.g., pair and/or set) of RF rails 112 having substantially parallel longitudinal axes 111. In an example embodiment, a first number of RF rails 112 have mutually substantially parallel longitudinal axes 111, a second number of RF rails 112 have mutually substantially parallel longitudinal axes 111, and the longitudinal axes of the first number of RF rails and the longitudinal axes of the second number of RF rails are substantially non-parallel (e.g., transverse). FIG. 1 illustrates an example one dimensional ion trap 100 having two RF rails 112, though other embodiments may comprise additional RF rails in various configurations.

In various embodiments, two adjacent RF rails 112 may be separated (e.g., insulated) from one another by a longitudinal gap 105. For example, the longitudinal gap may define (in one or two dimensions) the confinement channel or region of the ion trap 100 in which one or more atomic objects (e.g., ions in the case of the confinement apparatus being an ion trap 100) may be trapped at various locations within the ion trap. In various embodiments, the longitudinal gap 105 defined thereby may extend substantially parallel to the longitudinal axes 111 of the adjacent RF rails 112. For example, the longitudinal gap 105 may extend substantially parallel to the y-axis. In an example embodiment, the longitudinal gap 105 may be at least partially filled with an insulating material (e.g., a dielectric material). In various embodiments, the dielectric material may be silicon dioxide (e.g., formed through thermal oxidation) and/or other dielectric and/or insulating material. In various embodiments, the longitudinal gap 105 has a height (e.g., in the x-direction) of approximately 40 µm to 500 µm. In various embodiments, one or more sequences of TT electrodes 114 (e.g., a second sequence of TT electrodes 114B) may be disposed and/or formed within the longitudinal gap 105.

In an example embodiment, a transverse gap may exist between neighboring and/or adjacent electrodes 116 of the one or more sequences of electrodes 114. In an example embodiment, the transverse gap may be empty space and/or at least partially filled with a dielectric material to prevent electrical communication between neighboring and/or adjacent electrodes. In an example embodiment, the transverse gap between neighboring and/or adjacent electrodes may be in the range of approximately 1-10 µm.

In an example embodiment, a longitudinal gap exists between a sequence of TT electrodes 114 and a neighboring and/or adjacent RF rail 112. In an example embodiment, the longitudinal gap may be at least partially filled with a dielectric and/or insulating material to prevent electrical communication between TT electrodes 116 of the sequence of electrodes 114 and the RF rail 112. In an example embodiment, the longitudinal gap between neighboring and/or adjacent electrodes may be in the range of approximately 1-10 µm.

In various embodiments, the ion trap 100 may be at least partially defined by a number of sequences of TT electrodes 114 (e.g., first sequence of TT electrodes 114A, second sequence of electrodes 114B, third sequence of TT electrodes 114C). Each sequence of TT electrodes 114 is formed to extend substantially parallel to the substantially parallel longitudinal axes 111 of the RF rails 112. For example, the number of sequences of TT electrodes 114 may extend substantially parallel to the y-axis as shown in FIG. 1. In various embodiments, the number of sequences of TT electrodes 114 comprises two, three, four, and/or another number of sequences of TT electrodes 114. In an example embodiment, the ion trap 100 comprises a plurality of number of sequences of TT electrodes 114. For example, the illustrated ion trap 100 is a one-dimensional ion trap comprising three sequences of TT electrodes 114. For example, the ion trap 100 may be a two-dimensional ion trap that comprises multiple numbers of sequences of TT electrodes 114 that each extend substantially parallel to a substantially parallel longitudinal axes of a corresponding number of RF rails 112. In an example embodiment, a first number of sequences of TT electrodes 114 extend substantially parallel to the substantially parallel longitudinal axes 111 of a first number of RF rails 112, a second number of sequences of TT electrodes 114 extend substantially parallel to the substantially parallel longitudinal axes 111 of a second number of RF rails 112, and the longitudinal axes of the first number of RF rails and the longitudinal axes of the second number of RF rails are substantially non-parallel (e.g., transverse). In some embodiments, each of the TT electrodes 116 of the number of sequences of TT electrodes 114 can be formed with substantially coplanar upper surfaces that are substantially coplanar with the upper surfaces of the RF rails 112.

Figure 3:
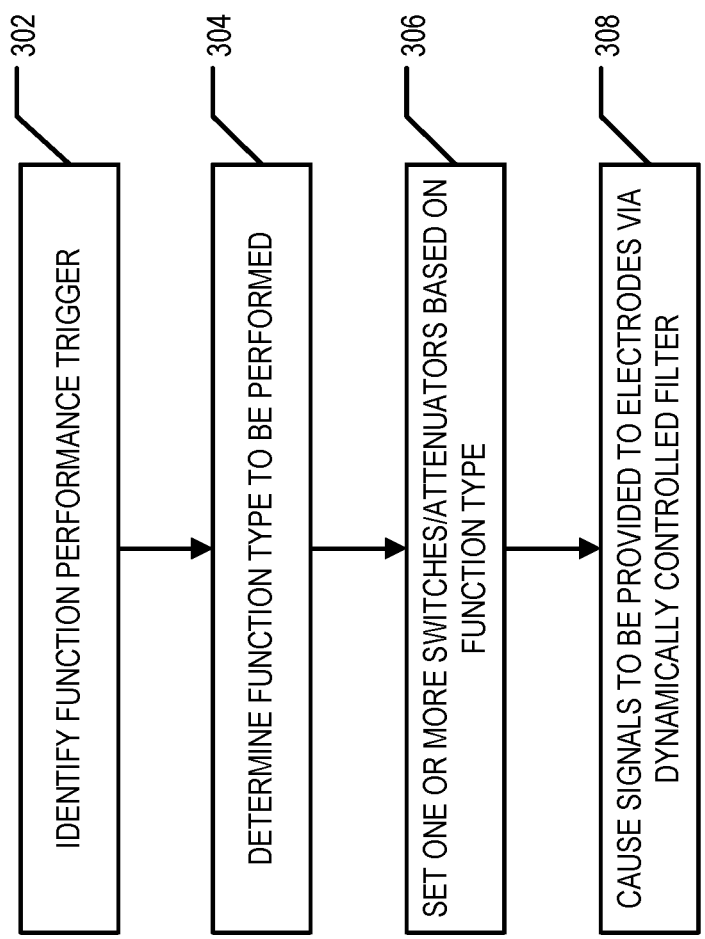
Figure 4:
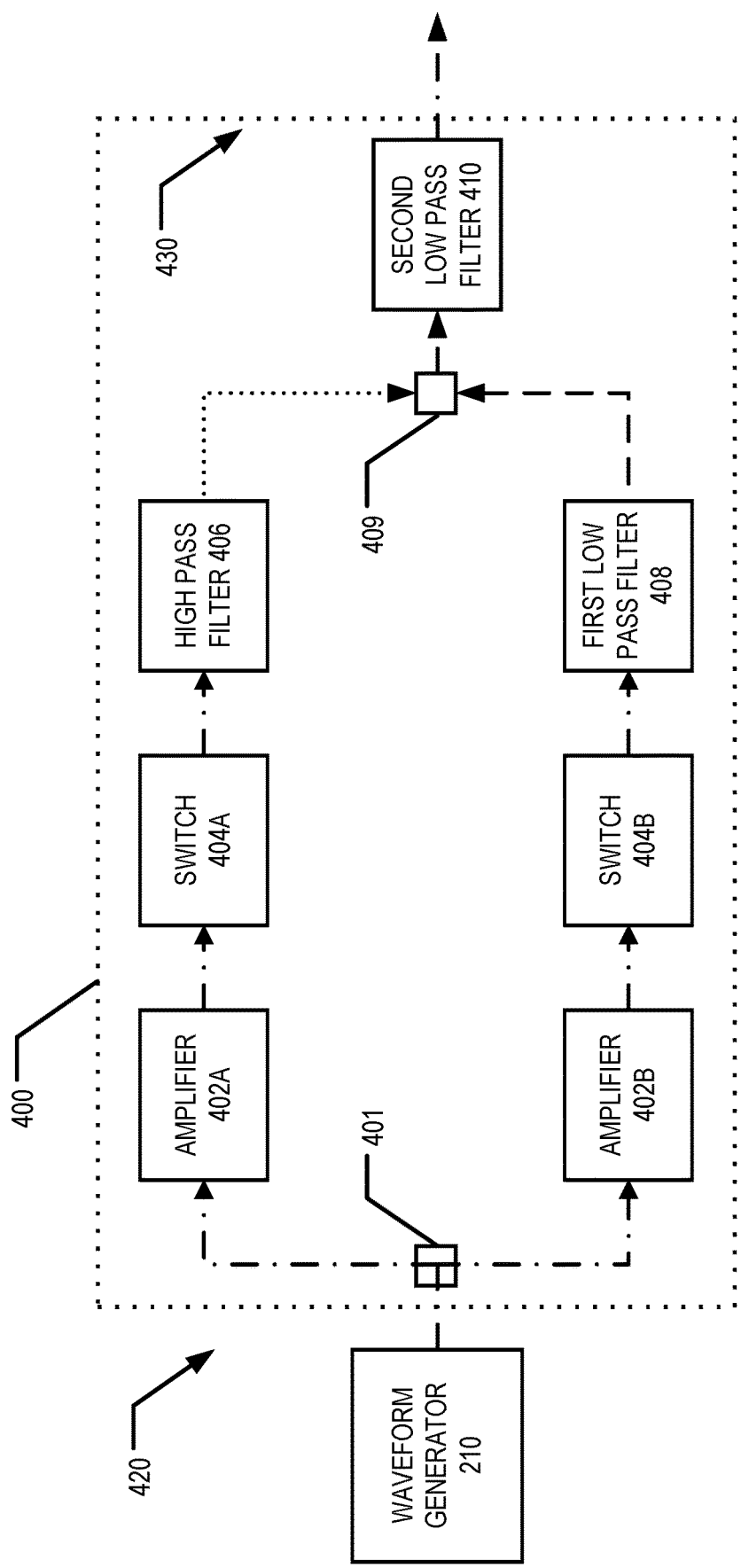
FIG. 4 is a schematic diagram of an example dynamic filter, in accordance with an example embodiment.
Figure 5:
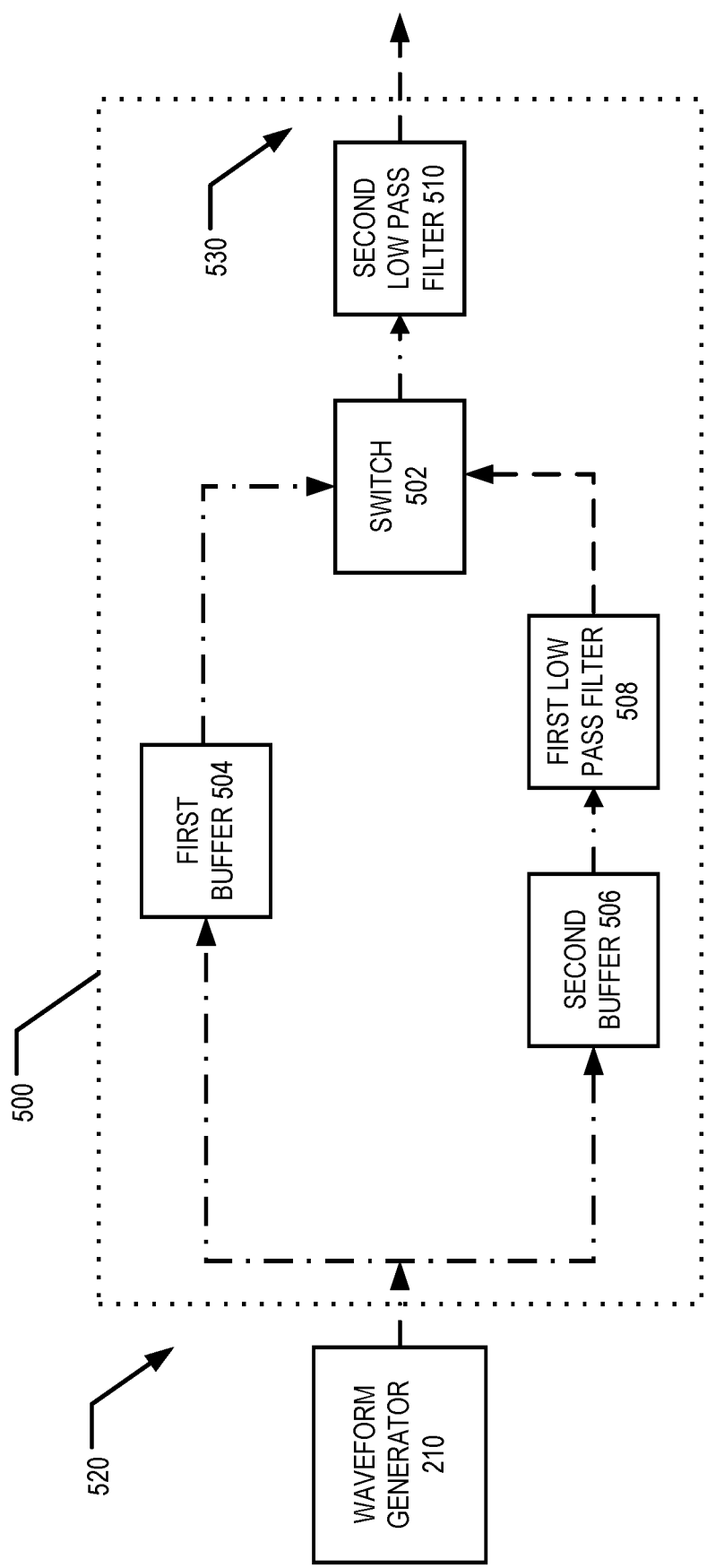
FIG. 5 is a schematic diagram of another example dynamic filter, in accordance with an example embodiment.

In an example embodiment (e.g., as illustrated in FIGS. 3-5), a number (e.g., pair) of RF rails 112 may be formed between a first sequence of TT electrodes 114A and a third sequence of TT electrodes 114C with a second sequence of TT electrodes 114B extending along the longitudinal channel 105 between the RF rails 112. For example, each sequence of TT electrodes 114 may extend in a direction substantially parallel to the longitudinal axes 111 of the RF rails (e.g., in the y-direction). In various embodiments, the upper surfaces of the sequences of TT electrodes 114 are substantially coplanar with the upper surfaces of the RF rails 112.

In various embodiments, RF signals may be applied to the RF rails 112 to generate an electric and/or magnetic field that acts to maintain an ion trapped within the ion trap 110 in directions transverse to the longitudinal direction of the ion trap 110 (e.g., the x- and z-directions). In various embodiments, TT voltages may be applied to the TT electrodes 116 to generate a time-dependent electric potential field that causes the objects of the group of objects to traverse corresponding trajectories to perform a deterministic reshaping and/or reordering function. In various embodiments, the number of sequences of TT electrodes 114 may, in combination, be biased, with TT voltages that contribute to a variable combined electrical and/or magnetic field to trap at least one atomic object (e.g., ion) in a potential well above at least one of either an upper surface of the sequences of TT electrodes 114 and/or the RF rails 112. For example, the electrical and/or magnetic field generated at least in part by voltages applied to the TT electrodes of the sequences of TT electrodes 114 may trap at least one atomic object in a potential well above the upper surface of the second sequence of TT electrodes 114B and/or the longitudinal gap 105. Additionally, the TT voltages applied to the electrodes 116 may cause ions trapped within the potential well above the upper surface of the second sequence of TT electrodes 114B and/or the longitudinal gap 105 to traverse trajectories corresponding to various functions of the ion trap.

Depending on factors such as the charge on the at least one atomic object and/or the shape and/or magnitude of the combined electrical and/or magnetic fields, the at least one atomic object can be stabilized at a particular distance (e.g., approximately 20 µm to approximately 200 µm) above an upper surface of the ion trap 110 (e.g., the coplanar upper surface of the sequences of TT electrodes 114 and RF rails 112). To further contribute to controlling the transit of atomic objects along desired trajectories, the ion trap 110 may be operated within a cryogenic and/or vacuum chamber capable of cooling the ion trap to a temperature of less than 124 Kelvin (e.g., less than 100 Kelvin, less than 50 Kelvin, less than 10 Kelvin, less than 5 Kelvin, and/or the like), in various embodiments.

In various embodiments, the RF rails 112, the sequences of electrodes 114, and/or the confinement potential generated by the RF rails and/or the sequences of electrodes 114 define a confinement plane 103 of the ion trap. In various embodiments, the RF rails 112, the sequences of electrodes 114, and/or the confinement potential generated by the RF rails and/or the sequences of electrodes 114 define an axis 101 of the ion trap.

Figure 6:
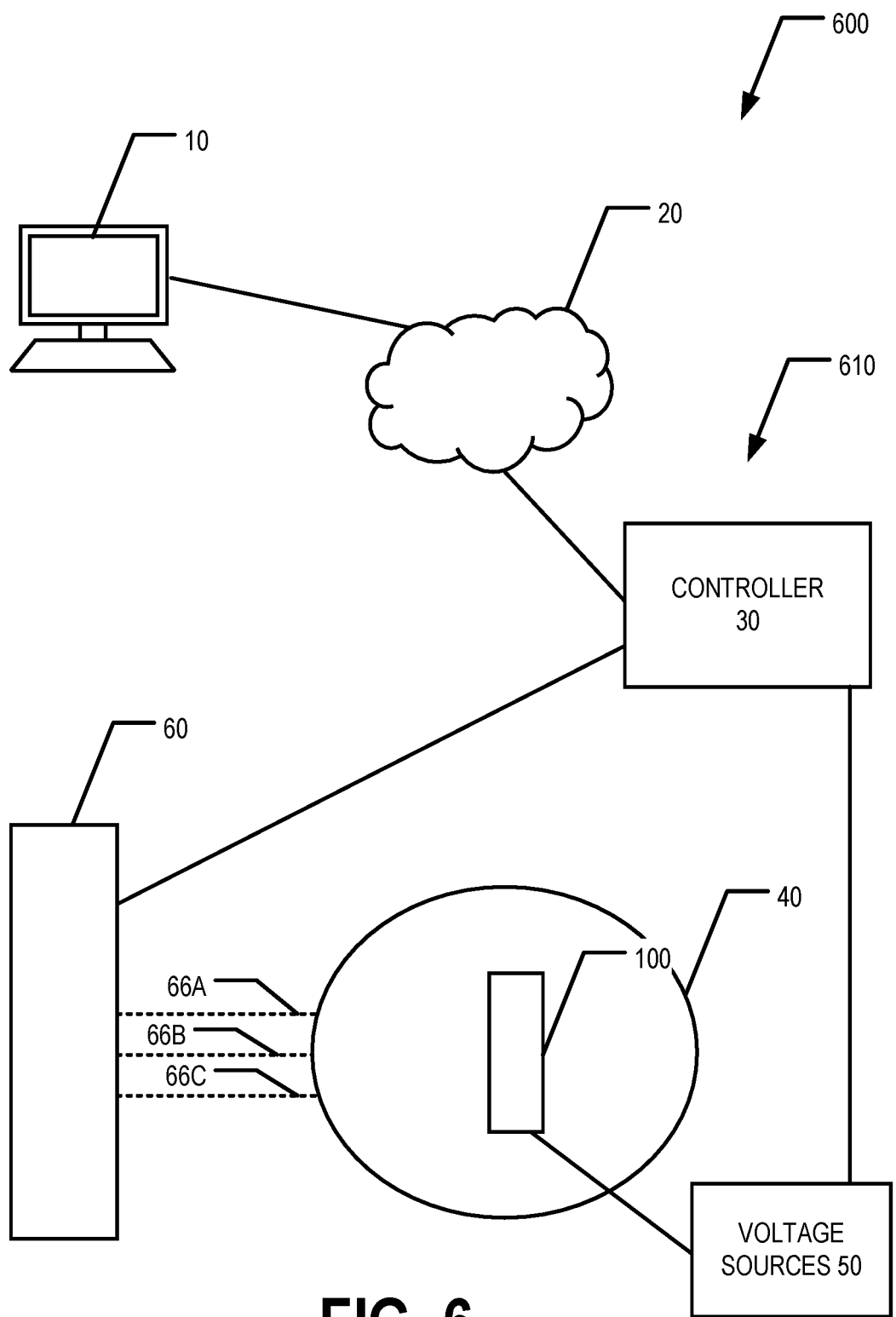
FIG. 6 is a schematic diagram illustrating an example quantum computing system configured to perform dynamic signal noise shaping, according to various embodiments.

In various embodiments, the TT voltages applied to the TT electrodes 116 are controlled by one or more connected devices (e.g., a controller 30 as shown in FIG. 6 and/or the like) via leads. For example, depending on the positive or negative charge on the at least one atomic object, TT voltages may be raised or lowered for TT electrodes 116 in the vicinity of a particular ion to cause the particular ion to traverse a desired trajectory. For example, a controller 30 may control a voltage driver to cause the voltage driver to apply TT voltages to the TT electrodes to generate a time-dependent electric potential (e.g., an electric potential that evolves with time) that causes various functions of the ion trap to be performed (e.g., transporting atomic objects from one location within the ion trap to another location in the ion trap, maintaining an atomic object in a particular location within the ion trap so that quantum logic gate may be performed on the atomic object, causing two atomic objects to swap positions within the ion trap, cause two atomic objects to move close together, cause two atomic objects that are close together to move apart from one another, and/or the like). In various embodiments, the voltage driver is in electrical communication with a TT electrode 116 via a dynamic filter. For example, the dynamic filter may be controlled (e.g., by a filter driver) to dynamically shape the noise in the signal applied to the TT electrodes 116 based on a function to be performed by/in the ion trap via the potential generated by the application of the signal to the TT electrodes.

Exemplary Dynamic Filter System

Figure 2:
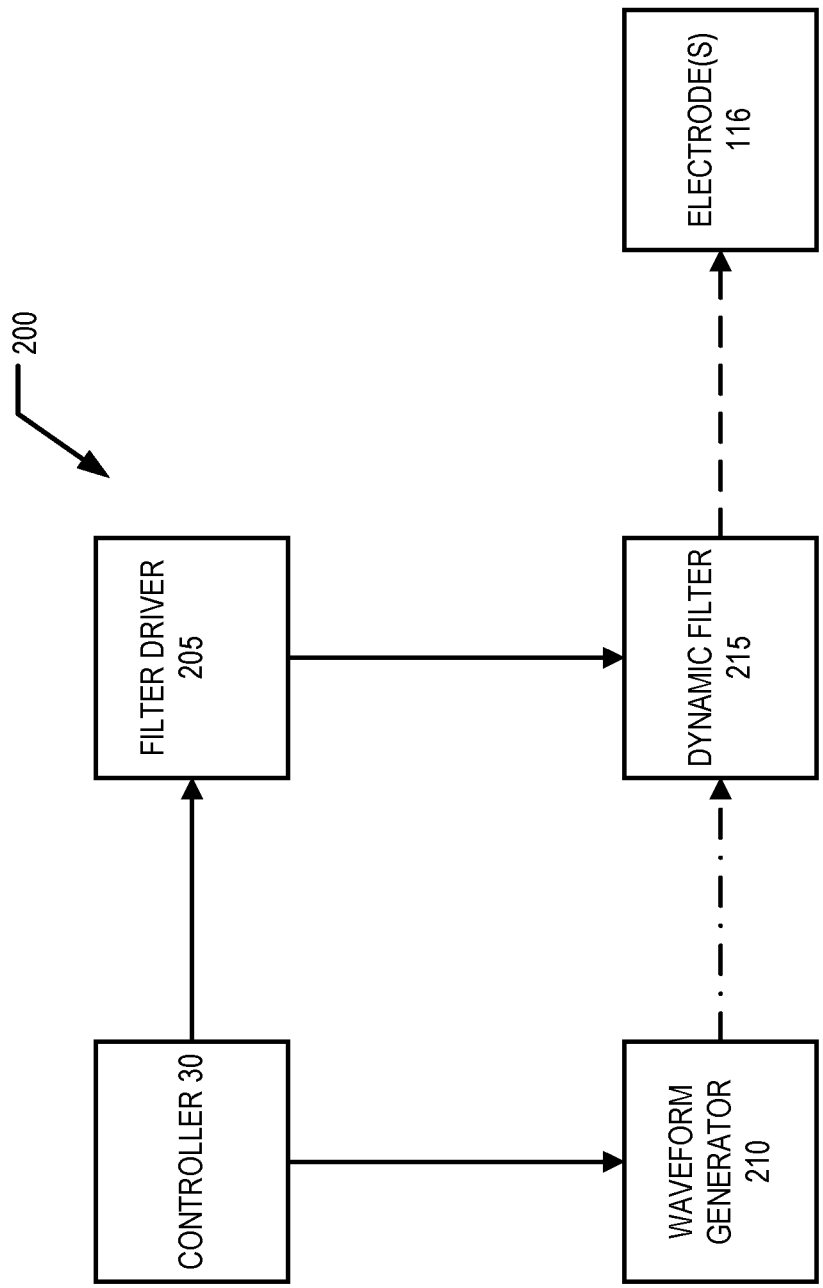

FIG. 2 illustrates an example dynamic filter system 200, in accordance with an example embodiment. In various embodiments, a controller 30 may control one or more waveform generators 210 (e.g., voltage sources 50 shown in FIG. 6) to cause signals (e.g., voltage signals) to be applied to electrical components (e.g., electrodes 116) of a system configured to perform multiple functions that have differing signal noise requirements. For example, as described above, the application of the signals to the electrodes 116 causes a potential field to be generated that may cause one or more functions to be performed on atomic objects captured within an ion trap 100. Different functions have different noise sensitivities and therefore different noise requirements. Thus, a dynamic filter system 200 may be used to dynamically shape the noise in the signal generated by one or more waveform generators 210 (or other signal generator) and applied to the electrodes 116. In an example embodiment, a waveform generator 210 is an arbitrary waveform generator (AWG).

In various embodiments, the dynamic filter system 200 comprises a dynamic filter 215 and a filter driver 205. In various embodiments, the filter driver 205 is controlled by the controller 30 to control the dynamic response of the dynamic filter 215. As noted above, a dynamic filter 215 is a filter that may be controlled to switch between/among two or more responses. For example, the response of a dynamic filter 215 may be dynamically controlled so as to dynamically shape the noise of a signal filtered using the dynamic filter. The filter driver 205 may control one or more switches, attenuators, and/or the like of the dynamic filter 215 to control the operating response. For example, the dynamic filter 215 may be capable of affecting a signal applied thereto via two or more responses which may be dynamically selected (e.g., via operation of the filter driver 205). The response that is currently selected (e.g., the response that is currently acting on the signal applied to the dynamic filter 215) is referred to as the operating response herein. The operating response may be a first response for a first time period and then, through operation of the filter driver 205, the operating response may be switched to a second response for a second time period.

In various embodiments, a dynamic filter 205 may comprise multiple (e.g., two or more) low-pass, high-pass, band-pass, and/or band-stop filtering elements. In an example embodiment, a buffer is used to drive the multiple filtering elements. For example, each filtering element may have a variable step attenuator and/or switch at its input end that may be used to include the filtering element in the filtering process or remove the filtering element from the filtering process (e.g., via operation of the filter driver 205). In an example embodiment, each filtering element is of the singly terminated type with a butterworth response. Various other filtering elements (e.g., having various responses) may be used in various embodiments. In an example embodiment, the low impedance side or ends of the filtering elements are connected together. The operating response of the dynamic filter 215 may then be selected by causing (e.g., via a logic interface of the filter and/or filter driver 205) the variable step attenuator and/or switch at the input of each filtering element to select the appropriate series of filtering elements for providing the desired operating response. Schematics for two example dynamic filters 215 (e.g., example dynamic filter 400 and example dynamic filter 500) are illustrated in FIGS. 4 and 5.

Thus, the controller 30 may control a waveform generator 210 (e.g., a voltage source 50) to provide a particular signal to a dynamic filter 215. The controller 30 may also control a filter driver 205 to control the operating response of a dynamic filter 215. The dynamic filter 215 may receive the signal generated by the waveform generation 210 (e.g., voltage source 50) and filter the signal in accordance with the operating response selected by the filter driver 205. The filtered signal (e.g., the signal with dynamically shaped noise) is then provided to the electrodes 116 so that the resulting potential field may be used to perform a function. Moreover, the filtered signal provided to the electrodes 116 has an appropriate noise profile for the function to be performed via potential field resulting from the application of the signal to the electrodes 116.

FIG. 3 provides a flowchart illustrating example processes, procedures, operations, and/or the like that may be performed by a controller 30, for example, to cause a signal with dynamically shaped noise to be provided to an electrical component (e.g., electrodes 116). For the sake of clarity, we focus on the application of a signal with dynamically shaped noise to a single electrode 116. However, as should be understood, a system may comprise a plurality of waveform generators 210, a plurality of dynamic filters 215, and a plurality of corresponding filter drivers 205 such that signals with dynamically shaped noise may be provided to a plurality of electrodes 116 and/or other electrical components.

Starting at step/operation 302, a function performance trigger may be identified. For example, the controller 30 (e.g., using processing device 705 shown in FIG. 7) may read a next command from a command queue. For example, the command may indicate that a particular set of voltages should be applied to a set of electrodes 116 to perform a particular function. The reading of the command may cause the controller 30 to identify a function performance trigger. At step/operation 304, the function to be performed is determined. For example, based on the command and/or the function performance trigger, the controller 30 (e.g., using processing device 705, memory 710, and/or the like) may determine the function to be performed. For example, as described above, the function may be transporting atomic objects from one location within the ion trap to another location in the ion trap, maintaining an atomic object in a particular location within the ion trap so that quantum logic gate may be performed on the atomic object, causing two atomic objects to swap positions within the ion trap, causing two atomic objects to move close together, causing two atomic objects that are close together move apart from one another, and/or the like, in an example embodiment. Based on the determined function, a corresponding response of a dynamic filter may be identified.

For example, the ion trap 100 may include 300 TT electrodes 116. Each TT electrode 116 may be associated with a wave generator 210 and a dynamic filter 215 such that the signal applied to each individual TT electrode 116 may be individually tailored. For example, the set of electrodes may include twelve electrodes. Based on the identified function to be performed via the application of the signals to the twelve electrodes, a response of the dynamic filters that corresponds to the function may be identified. The dynamic filters corresponding to the twelve electrodes may then be controlled (e.g., by filter drivers 205) to operate with an operating response that is the response identified as corresponding to the function.

For example, at step/operation 306, one or more switches and/or attenuators of each of the dynamic filters corresponding to the set of electrodes are operated so that the dynamic filter is operating with an operating response that is the response corresponding to the determined function. For example, the controller 30 (e.g., using driver controller elements 715) may cause one or more filter drivers 205 to operate one or more switches and/or attenuators of each of the dynamic filters 215 corresponding to the set of electrodes so that the filters will operate with an operating response that is the response corresponding to the determined function.

At step/operation 308, the controller 30 causes the wave generators 210 corresponding to the set of electrodes to generate signals in accordance with the command and provide the signals to the dynamic filters 205. The dynamic filters 205 filter the signals with the selected operating response (the response that corresponds to the determined function). The noise of the signals is thus dynamically shaped in accordance with the function the signal will cause the system to perform. The filtered signal is then applied to the corresponding electrode such that the function is performed.

In various embodiments, the process then returns to step/operation 302 and another command is read corresponding to another function. The operating response of the dynamic filter may be adjusted and/or switched accordingly so that the next signal is filtered, by the dynamic filter, using an operating response that corresponds to the function that next signal will cause the system to perform. As such, the process shown in FIG. 3 may be repeated as required for the controller 30 to cause the system to perform the desired functions.

A First Example Dynamic Filter

FIG. 4 illustrates a schematic of an example dynamic filter 400. In an example embodiment, the dynamic filter 400 comprises input end 420 and output end 430. In an example embodiment, the dynamic filter 400 comprises the filtering elements high pass filter 406, first low pass filter 408, and second low pass filter 410. In an example embodiment, the high pass filter 406 and the first low pass filter 408 have the same cut-off frequency. In an example embodiment, each of the high pass filter 406, first low pass filter 408, and the second low pass filter 410 have a butterworth response. As should be understood, a low pass filter passes frequencies lower than the cut-off frequency and does not pass frequencies higher than the cut-off frequency. A high pass filter passes frequencies higher than the cut-off frequency and does not pass frequencies lower than the cut-off frequency. As should be understood, the response of a filter around the cut-off frequency may not be an idealistic step function and may include some roll-over and/or a transition region.

In an example embodiment, the input end 420 receives the signal generated by the waveform generator 210. The signal is then split via splitter 401. A first portion of the split signal is passed to a first amplifier 402A and a second portion of the split signal is passed to a second amplifier 402B. The first portion of the split signal, after being amplified by the first amplifier 402A, is passed to a first switch/attenuator 404A. The first switch/attenuator 404A controls whether or not the first portion of the split signal is passed to the high pass filter 406. The low impedance end of the high pass filter 406 is in communication with a second low pass filter 410 via summing node or combiner 409. The second portion of the split signal, after being amplified by the second amplifier 402B, is passed to a second switch/attenuator 404B. The second switch/attenuator 404B controls whether or not the second portion of the split signal is passed to the first low pass filter 408. The low impedance end of the low pass filter 408 is in communication with a second low pass filter 410 via summing node or combiner 409. For example, the summing node or combiner 409 may receive the result of the first portion of the split signal interacting with the first amplifier 402A, the first switch/attenuator 404A, and the high pass filter 406 and may receive the result of the second portion of the split signal interacting with the second amplifier 402B, the second switch/attenuator 404B, and the first low pass filter 408. The summing node or combiner 409 may then combine the two received portions of the split signal and provide a combined signal to the second low pass filter 410.

In an example embodiment, the dynamic filter 400 may be operated with the operating response being a first response wherein the first portion of the split signal is passed to the high pass filter 406 and the second portion of the split signal is passed to the first low pass filter 408 followed by the recombination of the two filtered signals and filtering the combined signal using the second low pass filter 410. Thus, the first response is approximately a response corresponding to the second low pass filter 410 (e.g., in the example embodiment where the high pass filter 406 and the first low pass filter 408 have the same cut-off frequency). In an example embodiment, the dynamic filter 400 may be operated with the operating response being a second response wherein the first portion of the split signal is not passed to the high pass filter 406 and the second portion of the split signal is passed to the first low pass filter 408 followed by a filtering of the second portion of the split signal with the second low pass filter 410. Thus, the second response is a double low pass filter response. In an example embodiment, the cut-off frequency of the second low pass filter 410 is a higher frequency than the cut-off frequency of the first low pass filter 408 and the high pass filter 406. In an example embodiment, the dynamic filter 400 may be operated with the operating response being a third response wherein the first portion of the split signal is passed to the high pass filter 406 and the second portion of the split signal is not passed to the first low pass filter 408 followed by a filtering of the first portion of the split signal with the second low pass filter 410. Thus, the third response is a band pass filter response that passes the band between the cut-off frequency of the high pass filter 406 and the cut-off frequency of the second low pass filter 410.

Another Example Dynamic Filter

FIG. 5 illustrates a schematic of an example dynamic filter 500. In an example embodiment, the dynamic filter 500 comprises input end 520 and output end 530. In an example embodiment, the dynamic filter 500 comprises the filtering elements of a first low pass filter 508, and a second low pass filter 510. In an example embodiment, each of the first low pass filter 508 and the second low pass filter 510 has a butterworth response.

In an example embodiment, the input end 520 receives the signal generated by the waveform generator 210. In various embodiments, the signal is provided to a first arm of the dynamic filter and/or a second arm of the dynamic filter. For example, the signal generated by the waveform generator 210 and received by the input end 520 may be passed and/or provided (e.g., via leads, traces, and/or the like) to the first arm comprising to a first buffer 504. The first buffer 504 is configured to receive the signal and adapt the signal for any desired and/or required time delay such that the timing of when the signal is applied to the corresponding electrode may be accurately and/or precisely controlled. The first buffer 504 may then pass the (buffered and/or delayed) signal to a second low pass filter 510, via a switch/attenuator 502. For example, the signal generated by the waveform generator 210 and received by the input end 520 may be passed and/or provided (e.g., via leads, traces, and/or the like) to the second arm comprising a second buffer 506. The second buffer 506 is configured to receive the signal and adapt the signal for any desired and/or required time delay such that the timing of when the signal is applied to the corresponding electrode may be accurately and/or precisely controlled. The second arm may further comprise a first low pass filter 508. For example, the second buffer 506 may pass the (buffered and/or delayed) signal to a first low pass filter 508. The first low pass filter may then pass the (filtered buffered and/or delayed) signal to the second low pass filter, possibly via the switch/attenuator 502. The low impedance end of the first low pass filter 508 is in communication with a second low pass filter 510.

In various embodiments, the switch/attenuator 502 is operated to determine whether the signal processed by the first arm or the signal processed by the second arm is passed to the second low pass filter 510. For example, the controller 30 may control the switch/attenuator 502 to cause the appropriate signal (e.g., the signal processed/adapted via the first arm or the signal processed/adapted via the second arm) for one or more operations to be performed by the quantum computer, for example, to be provided to the second low pass filter 510.

In an example embodiment, the dynamic filter 500 may be operated with the operating response being a first response wherein the signal is buffered and filtered by the second low pass filter 510. Thus, the first response is a low pass filter response. In an example embodiment, the dynamic filter 500 may be operated with the operating response being a second response wherein the signal is buffered and filtered by the first low pass filter 508 and the second low pass filter 510. Thus, the second response is a double low pass filter response. In an example embodiment, the cut-off frequency of the second low pass filter 510 is a higher frequency than the cut-off frequency of the first low pass filter 508.

Technical Advantages

Various embodiments provide technical solutions to the technical problem of generating and providing signals to a system that cause the system to perform different functions, wherein the different functions have different noise tolerances. For example, in the example system of the trapped ion quantum computer described above, when performing the transport function, performance of the function may be sensitive to noise at frequencies around 1 MHz and when performing the maintaining function (e.g., maintaining the atomic object at a particular location within the ion trap so that a quantum logic gate may be executed on the atomic object), performance of the function may be sensitive to noise at frequencies around 250 kHz. Current methods for noise shaping of the signals includes filtering all of the signals based on the noise tolerances of the function having the most stringent noise tolerances. However, in the described example, performing the transport function using the noise requirements configured to optimize performance of the maintaining function, leads to decreased performance of the transport function. For example, performing the transport function using the noise requirements configured to optimize performance of the maintaining function decreases the speed and/or bandwidth with which the transport function may be performed. Example embodiments provide technical solutions to these technical problems by providing dynamic filters and methods for using dynamic filters to dynamically shape the noise of a signal based on the function the signal is going to cause the system to perform. Thus, example embodiments provide technical solutions that lead to improved system performance. For example, in the above described example, a signal used for performing the transport function may have the noise of the signal dynamically shaped based on the noise tolerances of the transport function and a signal used for performing the maintaining function may have the noise of the signal dynamically shaped based on the noise tolerances of the maintaining function such that both the transport function and the maintaining function may be effectively performed and the bandwidth/speed with which the transport function is performed is not hampered by excessive noise shaping.

Exemplary Quantum Computer Comprising an Ion Trap Apparatus

As described above, the dynamic filter may be part of a quantum computer 610. For example, dynamic filters 215 may be used to dynamically shape the noise of signals being applied to electrodes 116 of an ion trap that traps atomic objects used as the qubits of the quantum computer 610.

FIG. 6 provides a schematic diagram of an example quantum computer system 600 comprising a confinement apparatus (e.g., ion trap 100), in accordance with an example embodiment. In various embodiments, the quantum computer system 600 comprises a computing entity 10 and a quantum computer 610. In various embodiments, the quantum computer 610 comprises a controller 30, a cryostat and/or vacuum chamber 40 enclosing a confinement apparatus (e.g., ion trap 100), and one or more manipulation sources 60. In an example embodiment, the one or more manipulation sources 60 may comprise one or more lasers (e.g., optical lasers, microwave sources, and/or the like). Beams, pulses, fields, and/or the like generated by the manipulation sources 60 may be provided to the ion trap 100 via one or more optical paths 66 (e.g., 66A, 66B, 66C) in an example embodiment. In various embodiments, the one or more manipulation sources 60 are configured to manipulate and/or cause a controlled quantum state evolution of one or more atomic objects within the confinement apparatus. For example, in an example embodiment, wherein the one or more manipulation sources 60 comprise one or more lasers, the lasers may provide one or more laser beams to the confinement apparatus within the cryogenic and/or vacuum chamber 40. In various embodiments, the quantum computer 610 comprises one or more voltage sources 50. For example, the voltage sources 50 may comprise a plurality of TT voltage drivers and/or voltage sources and/or at least one RF driver and/or voltage source. For example, the voltage sources 50 may comprise one or more waveform generators 210. The voltage sources 50 may be electrically coupled to the corresponding potential generating elements (e.g., TT electrodes 116) of the confinement apparatus (e.g., ion trap 100) via a dynamic filter 215, in an example embodiment.

In various embodiments, a computing entity 10 is configured to allow a user to provide input to the quantum computer 610 (e.g., via a user interface of the computing entity 10) and receive, view, and/or the like output from the quantum computer 610. The computing entity 10 may be in communication with the controller 30 of the quantum computer 610 via one or more wired or wireless networks 20 and/or via direct wired and/or wireless communications. In an example embodiment, the computing entity 10 may translate, configure, format, and/or the like information/data, quantum computing algorithms, and/or the like into a computing language, executable instructions, command sets, and/or the like that the controller 30 can understand and/or implement.

In various embodiments, the controller 30 is configured to control the voltage sources 50, cryogenic system and/or vacuum system controlling the temperature and pressure within the cryogenic and/or vacuum chamber 40, manipulation sources 60, and/or other systems controlling various environmental conditions (e.g., temperature, pressure, and/or the like) within the cryogenic and/or vacuum chamber 40 and/or configured to manipulate and/or cause a controlled evolution of quantum states of one or more atomic objects within the confinement apparatus. For example, the controller 30 may cause a controlled evolution of quantum states of one or more atomic objects within the confinement apparatus to execute a quantum circuit and/or algorithm. In various embodiments, the atomic objects confined within the confinement apparatus are used as qubits of the quantum computer 610.

Exemplary Controller

In various embodiments, a confinement apparatus is incorporated into a quantum computer 610. In various embodiments, a quantum computer 610 further comprises a controller 30 configured to control various elements of the quantum computer 610. For example, the controller 30 may be configured to control the voltage sources 50, a cryogenic system and/or vacuum system controlling the temperature and pressure within the cryogenic and/or vacuum chamber 40, manipulation sources 60, and/or other systems controlling the environmental conditions (e.g., temperature, humidity, pressure, and/or the like) within the cryogenic and/or vacuum chamber 40 and/or configured to manipulate and/or cause a controlled evolution of quantum states of one or more atomic objects within the confinement apparatus.

As shown in FIG. 7, in various embodiments, the controller 30 may comprise various controller elements including processing elements 705, memory 710, driver controller elements 715, a communication interface 720, analog-digital converter elements 725, and/or the like. For example, the processing elements 705 may comprise programmable logic devices (PLDs), complex PLDs (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, and/or the like, and/or controllers. The term circuitry may refer to an entirely hardware embodiment or a combination of hardware and computer program products. In an example embodiment, the processing element 705 of the controller 30 comprises a clock and/or is in communication with a clock.

For example, the memory 710 may comprise non-transitory memory such as volatile and/or non-volatile memory storage such as one or more of as hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. In various embodiments, the memory 710 may store qubit records corresponding the qubits of quantum computer (e.g., in a qubit record data store, qubit record database, qubit record table, and/or the like), a calibration table, an executable queue, computer program code (e.g., in a one or more computer languages, specialized controller language(s), and/or the like), and/or the like. In an example embodiment, execution of at least a portion of the computer program code stored in the memory 710 (e.g., by a processing element 705) causes the controller 30 to perform one or more steps, operations, processes, procedures and/or the like described herein for applying signals with dynamically shaped noise to electrodes of the ion trap 100 for performance of a function that corresponds to the dynamically shaped noise.

In various embodiments, the driver controller elements 715 may include one or more drivers and/or controller elements each configured to control one or more drivers. In various embodiments, the driver controller elements 715 may comprise drivers and/or driver controllers. For example, the driver controllers may be configured to cause one or more corresponding drivers to be operated in accordance with executable instructions, commands, and/or the like scheduled and executed by the controller 30 (e.g., by the processing element 705). In various embodiments, the driver controller elements 715 may enable the controller 30 to operate a manipulation source 60. In various embodiments, the drivers may be laser drivers; vacuum component drivers; drivers for controlling the flow of current and/or voltage applied to TT, RF, (e.g., voltage sources 50), and/or other electrodes used for maintaining and/or controlling the ion trapping potential of the ion trap 100 (and/or other driver for providing driver action sequences to potential generating elements of the confinement apparatus); drivers for controlling the operating response of one or more dynamic filters (e.g., filter drivers 205); cryogenic and/or vacuum system component drivers; and/or the like. For example, the drivers may control and/or comprise TT and/or RF voltage drivers and/or voltage sources that provide voltages and/or electrical signals to the TT electrodes 116 and/or RF rails 112. In various embodiments, the controller 30 comprises means for communicating and/or receiving signals from one or more optical receiver components such as cameras, MEMs cameras, CCD cameras, photodiodes, photomultiplier tubes, and/or the like. For example, the controller 30 may comprise one or more analog-digital converter elements 725 configured to receive signals from one or more optical receiver components, calibration sensors, and/or the like.

In various embodiments, the controller 30 may comprise a communication interface 720 for interfacing and/or communicating with a computing entity 10. For example, the controller 30 may comprise a communication interface 720 for receiving executable instructions, command sets, and/or the like from the computing entity 10 and providing output received from the quantum computer 610 (e.g., from an optical collection system) and/or the result of a processing the output to the computing entity 10. In various embodiments, the computing entity 10 and the controller 30 may communicate via a direct wired and/or wireless connection and/or one or more wired and/or wireless networks 20.

Exemplary Computing Entity

FIG. 8 provides an illustrative schematic representative of an example computing entity 10 that can be used in conjunction with embodiments of the present invention. In various embodiments, a computing entity 10 is configured to allow a user to provide input to the quantum computer 610 (e.g., via a user interface of the computing entity 10) and receive, display, analyze, and/or the like output from the quantum computer 610.

As shown in FIG. 8, a computing entity 10 can include an antenna 812, a transmitter 804 (e.g., radio), a receiver 806 (e.g., radio), and a processing element 808 that provides signals to and receives signals from the transmitter 804 and receiver 806, respectively. The signals provided to and received from the transmitter 804 and the receiver 806, respectively, may include signaling information/data in accordance with an air interface standard of applicable wireless systems to communicate with various entities, such as a controller 30, other computing entities 10, and/or the like. In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1x (1xRTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The computing entity 10 can also download changes, add-ons, and updates, for instance, to its firmware, software (e.g., including executable instructions, applications, program modules), and operating system.

The computing entity 10 may also comprise a user interface device comprising one or more user input/output interfaces (e.g., a display 816 and/or speaker/speaker driver coupled to a processing element 808 and a touch screen, keyboard, mouse, and/or microphone coupled to a processing element 808). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 818 (hard or soft), a touch display, voice/speech or motion interfaces, scanners, readers, or other input device. In embodiments including a keypad 818, the keypad 818 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 822 and/or non-volatile storage or memory 824, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

CONCLUSION

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A system for providing a signal with dynamically shaped noise, the system comprising:
    a dynamic filter, wherein a dynamic filter is a filter that is capable of switching between at least two responses;
    a signal generator configured to generate a signal; and
    a controller configured to control operation of the signal generator and selection of an operating response from the at least two responses of the dynamic filter,
    wherein the controller causes the signal generator to generate a signal, the signal provided to the dynamic filter, and the controller causes the dynamic filter to filter the signal in accordance with the operating response, the filtered signal provided to an electrical component of the system, the electrical component is an electrode of an ion trap configured to trap a plurality of ions therein.

2. The system of claim 1, further comprising a filter driver, wherein the filter driver is controlled by the controller to activate one or more switches or attenuators of the dynamic filter to select the operating response from the at least two responses of the dynamic filter.

3. The system of claim 1, wherein the at least two responses comprise a first response and a second response,
    the first response being a combined response corresponding to the signal passing through a first low pass filter characterized by a first low pass filter response and a second low pass filter characterized by a second low pass filter response in series, and
    the second response being the second low pass filter response, the second low pass filter response having a higher cut-off frequency than the first low pass filter response.

4. The system of claim 1, wherein the at least two responses comprise a first response and a second response,
    the first response being a recombined response corresponding to the signal being split into a first portion and a second portion, the first portion passing through a high pass filter characterized by a high pass filter response and then being recombined with the second portion after the second portion passes through a first low pass filter characterized by a first low pass filter response, to form a recombined signal, the recombined signal then being passed through a second low pass filter characterized by a second low pass filter response, the high pass filter response and the first low pass filter response having a same cut-off frequency, and
    the second response corresponding to the signal passing through the first low pass filter and the second low pass filter in series, the second low pass filter response having a higher cut-off frequency than the first low pass filter response.

5. The system of claim 1, wherein the controller is further configured to:
    determine, based at least in part on a command queue comprising commands to be executed by the controller, a function to be performed by the system via application of the filtered signal to the electrical component of the system; and
    select the operating response from the at least two responses based on the determined function.

6. The system of claim 5, wherein the controller is further configured to:
    determine, based at least in part on the command queue, a second function to be performed by the system;
    select a second operating response from the at least two responses based on the determined second function; and
    cause the dynamic filter to filter a second part of the signal to be filtered based on the second operating response, wherein application of the second part of the signal to the electrical component of the system causes the system to perform the second function.

7. The system of claim 1, wherein the system is a quantum computer.

8. The system of claim 7, wherein at least some of the plurality of ions are used as qubits of the quantum computer.

9. A method for providing a signal with dynamically shaped noise to an electrical component of a system, the method comprising:
    causing, by a controller of the system, a signal generator to generate a signal; and
    causing, by the controller, a dynamic filter to operate with an operating response, wherein the dynamic filter is a filter that is capable of switching between at least two responses, wherein
    the signal generated by the signal generator is provided to the dynamic filter, the dynamic filter filters the signal in accordance with the operating response, and the filtered signal is provided to the electrical component of the system, the electrical component is an electrode of an ion trap configured to trap a plurality of ions therein.

10. The method of claim 9, wherein the controller causes the dynamic filter to operate with the operating response by controlling a filter driver, wherein the filter driver is controlled by the controller to activate one or more switches or attenuators of the dynamic filter to select the operating response from the at least two responses of the dynamic filter.

11. The method of claim 9, wherein the at least two responses comprise a first response and a second response,
    the first response being a combined response corresponding to the signal passing through a first low pass filter characterized by a first low pass filter response and a second low pass filter characterized by a second low pass filter response in series, and the second response being the second low pass filter response, the second low pass filter response having a higher cut-off frequency than the first low pass filter response.

12. The method of claim 9, wherein the at least two responses comprise a first response and a second response,
the first response being a recombined response corresponding to the signal being split into a first portion and a second portion, the first portion passing through a high pass filter characterized by a high pass filter response and then being recombined with the second portion, after the second portion passes through a first low pass filter characterized by a first low pass filter response, to form a recombined signal, the recombined signal then being passed through a second low pass filter characterized by a second low pass filter response, the high pass filter response and the first low pass filter response having a same cut-off frequency, and
the second response corresponding to the signal passing through the first low pass filter and the second low pass filter in series, the second low pass filter response having a higher cut-off frequency than the first low pass filter response.

13. The method of claim 9, further comprising:
determining, by the controller and based at least in part on a command queue comprising commands to be executed by the controller, a function to be performed by the system via application of the filtered signal to the electrical component of the system; and
selecting, by the controller, the operating response from the at least two responses based on the determined function.

14. The method of claim 13, further comprising:
determining, by the controller and based at least in part on the command queue, a second function to be performed by the system;
selecting, by the controller, a second operating response from the at least two responses based on the determined second function; and
causing, by the controller, the dynamic filter to filter a second part of the signal to be filtered based on the second operating response, wherein application of the second part of the signal to the electrical component of the system causes the system to perform the second function.

15. The method of claim 9, wherein the system is a quantum computer.

16. The method of claim 15, wherein at least some of the plurality of ions are used as qubits of the quantum computer.

17. A computer program product, the computer program product comprising a non-transitory, machine-readable storage medium storing executable instructions that, when executed with a processor of a controller, cause the controller to:
cause a signal generator to generate a signal; and
cause a dynamic filter to operate with an operating response, wherein the dynamic filter is a filter that is capable of switching between at least two responses, wherein
the signal generated by the signal generator is provided to the dynamic filter, the dynamic filter filters the signal in accordance with the operating response, and the filtered signal is provided to an electrical component of a system, the electrical component is an electrode of an ion trap configured to trap a plurality of ions therein.

18. The computer program product of claim 17, wherein the executable instructions, when executed with a processor of a controller, further cause the controller to:
determine, based at least in part on a command queue comprising commands to be executed by the controller, a function to be performed by the system via application of the filtered signal to the electrical component of the system; and
select the operating response from the at least two responses based on the determined function.

19. The computer program product of claim 18, wherein the executable instructions, when executed with a processor of a controller, further cause the controller to:
determine, by the controller and based at least in part on the command queue, a second function to be performed by the system;
select, by the controller, a second operating response from the at least two responses based on the determined second function; and
cause, by the controller, the dynamic filter to filter a second part of the signal to be filtered based on the second operating response, wherein application of the second part of the signal to the electrical component of the system causes the system to perform the second function.

20. The computer program product of claim 17, wherein the system is a quantum computer, and the electrical component is an electrode of an ion trap having a plurality of ions trapped therein, at least some of the plurality of ions being used as qubits of the quantum computer.

* * * * *